US008470629B2

(12) United States Patent
Mikami et al.

(10) Patent No.: US 8,470,629 B2
(45) Date of Patent: Jun. 25, 2013

(54) METHOD FOR MANUFACTURING MICROMACHINE

(75) Inventors: Mayumi Mikami, Kanagawa (JP); Konami Izumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 37 days.

(21) Appl. No.: 13/189,734

(22) Filed: Jul. 25, 2011

(65) Prior Publication Data

US 2011/0281389 A1 Nov. 17, 2011

Related U.S. Application Data

(62) Division of application No. 12/327,341, filed on Dec. 3, 2008, now Pat. No. 7,999,335.

(30) Foreign Application Priority Data

Dec. 5, 2007 (JP) .................................. 2007-314456

(51) Int. Cl.
*H01L 21/00* (2006.01)
*H01L 21/302* (2006.01)

(52) U.S. Cl.
USPC ............................................ 438/50; 438/739

(58) Field of Classification Search
CPC ... H01L 21/76802; H01L 21/84; H01L 27/016; B81C 1/00015; B81C 1/00246
USPC ............................................ 438/50, 494, 739
See application file for complete search history.

(56) References Cited

U.S. PATENT DOCUMENTS

| 6,396,368 | B1 | 5/2002 | Chow et al. |
| 6,667,245 | B2 | 12/2003 | Chow et al. |
| 7,202,497 | B2 | 4/2007 | Ohtani et al. |
| 7,256,670 | B2 | 8/2007 | Jahnes et al. |
| 8,053,850 | B2 | 11/2011 | Yamaguchi et al. |
| 2006/0270238 | A1 | 11/2006 | Izumi et al. |
| 2012/0037966 | A1 | 2/2012 | Yamaguchi et al. |

FOREIGN PATENT DOCUMENTS

| JP | 7-66280 | 3/1995 |
| JP | 2003-515235 | 4/2003 |
| JP | 2005-536847 | 12/2005 |
| JP | 2007-38394 | 2/2007 |
| WO | WO 01/35433 A2 | 5/2001 |
| WO | WO 2004/019362 A1 | 3/2004 |

*Primary Examiner* — Nikolay Yushin
(74) *Attorney, Agent, or Firm* — Husch Blackwell LLP

(57) ABSTRACT

A structure which prevents thinning and disconnection of a wiring is provided, in a micromachine (MEMS structure body) formed with a surface micromachining technology. A wiring (upper auxiliary wiring) over a sacrificial layer is electrically connected to a different wiring (upper connection wiring) over the sacrificial layer, so that thinning, disconnection, and the like of the wiring formed over the sacrificial layer at a step portion generated due to the thickness of the sacrificial layer can be prevented. The wiring over the sacrificial layer is formed of the same conductive film as an upper driving electrode which is a movable electrode and is thus thin. However, the different wiring is formed over a structural layer, which is formed by a CVD method and has a rounded step, and has a thickness of 200 nm to 1 μm, whereby thinning, disconnection, and the like of the wiring can be further prevented.

20 Claims, 5 Drawing Sheets

METHOD FOR MANUFACTURING MICROMACHINE

This application is a divisional of application Ser. No. 12/327,341 filed on Dec. 3, 2008 now U.S. Pat. No. 7,999,335.

BACKGROUND OF THE INVENTION

1. Field of the Invention

The present invention relates to a structure of a micromachine which is formed with a microelectromechanical system (MEMS) technology.

2. Description of the Related Art

These days, MEMS switches which utilize a MEMS technology, and sensors, resonators, communication devices, and the like which are provided with the MEMS switches have been attracting attention.

These are also called micromachines, and there are two kinds of technologies, a surface micromachining technology and a bulk micromachining technology, depending on manufacturing methods. In the surface micromachining technology, thin films are stacked over a substrate and then processed by a photolithography method or an etching method, whereby a MEMS structure body can be formed. Further, in the bulk micromachining technology, a silicon wafer or a silicon on insulator (SOI) substrate itself is processed by etching or polishing, whereby a MEMS structure body can be formed.

In particular, great importance is placed on the surface micromachining technology because a semiconductor process can be applied thereto. However, through the surface micromachining technology, a MEMS structure body has a three-dimensional structure in which thin films are stacked, and thus, a connection wiring which is formed at a step portion generated due to a thick layer (for example, a sacrificial layer) is easily thinned or disconnected; therefore, there is a problem in that the reliability of the wiring is significantly lowered.

Therefore, a method is proposed by which, in the case that a wiring is formed at a step portion generated due to a thick layer, the thick film is easily tapered with a given angle and the taper angle can more easily be controlled (for example, see Reference 1: Japanese Published Patent Application No. H7-66280).

SUMMARY OF THE INVENTION

However, in the MEMS structure body, because the sacrificial layer is very thick, it is difficult to control a process to achieve formation of a desired taper shape in the sacrificial layer so that thinning and disconnection of the wiring can be prevented.

In view of the foregoing problems, it is an object of the present invention to provide a structure which prevents thinning and disconnection of a wiring at a step portion of a sacrificial layer, in a micromachine (MEMS structure body) which is formed with the surface micromachining technology.

In order to solve the foregoing problems, in the present invention, wirings (upper auxiliary wirings) are formed over a sacrificial layer by using the same conductive film and in the same plane as those of upper driving electrodes and are electrically connected to different wirings (upper connection wirings) whose thickness can be relatively freely determined, over the sacrificial layer. Further, a step portion generated due to the thickness of the sacrificial layer is rounded by a structural layer which is formed over the sacrificial layer using a film obtained by a CVD method, and the different wirings are formed over the structural layer.

Further, in the present invention, the structural layer is formed over the entire surface where films are formed (that is, the structural layer is formed to cover underlying films), so that all the different wirings (the upper connection wirings) can be formed over the structural layer.

Specifically, according to an aspect of the present invention, a micromachine includes a first electrode over a substrate having an insulating surface, a second electrode and an auxiliary wiring over the first electrode with a space interposed therebetween, and a connection wiring over the auxiliary wiring. In this structure, the second electrode, the auxiliary wiring, and the connection wiring are electrically connected to one another; the first electrode is a fixed electrode; the second electrode is a movable electrode; the second electrode and the auxiliary wiring are formed in the same plane; and the auxiliary wiring and the connection wiring are electrically connected to each other over the space.

Further, according to another aspect, a micromachine includes a first electrode over a substrate having an insulating surface, a second electrode and an auxiliary wiring over the first electrode with a space interposed therebetween, a structural layer over the second electrode and the auxiliary wiring, and a connection wiring over the structural layer. In this structure, the first electrode is a fixed electrode; the second electrode is a movable electrode; the second electrode and the auxiliary wiring are formed in the same plane and electrically connected to each other; and the auxiliary wiring and the connection wiring are electrically connected to each other through an opening which is provided in the structural layer.

In the above structure, the structural layer is formed using a film which is formed by a CVD method.

In the above structure, the thickness of the connection wiring is 200 nm to 1 μm, preferably 300 to 600 nm.

In the above structure, the connection wiring is formed of a metal material such as tantalum (Ta), aluminum (Al), titanium (Ti), molybdenum (Mo), tungsten (W), gold (Au), or platinum (Pt), or metal oxide or metal nitride of the metal material.

Furthermore, according to another aspect of the present invention, a method for manufacturing a micromachine includes the following steps: forming a first electrode over a substrate having an insulating surface, forming a sacrificial layer over the first electrode, forming a second electrode and an auxiliary wiring which are electrically connected to each other over the sacrificial layer, forming a structural layer over the second electrode and the auxiliary wiring, forming a first opening in the structural layer in a position overlapping with the auxiliary wiring, forming a connection wiring over the structural layer to be electrically connected to the auxiliary wiring through the first opening, forming a second opening in the structural layer in a position overlapping with the sacrificial layer, and removing the sacrificial layer by etching using the second opening.

In the above method, the structural layer is formed by a CVD method.

According to the present invention, in a micromachine (MEMS structure body) which is formed with a surface micromachining technology, a wiring (an upper auxiliary wiring) formed over a sacrificial layer is electrically connected to a different wiring (an upper connection wiring) over the sacrificial layer. Thus, thinning, disconnection, and the like of the wiring formed over the sacrificial layer at a step portion generated due to the thickness of the sacrificial layer can be prevented, whereby a highly reliable micromachine can be provided.

DETAILED DESCRIPTION OF THE INVENTION

Hereinafter, an embodiment mode of the present invention will be described in detail with reference to the drawings. Note that the present invention is not limited to the following description, and modes and details thereof can be modified in various ways without departing from the spirit and the scope of the present invention. Therefore, the present invention should not be construed as being limited to the following description of the embodiment mode.

Embodiment Mode 1

In Embodiment Mode 1, a structure of a microelectromechanical system (MEMS) switch which is a micromachine according to the present invention will be described.

Figure 1:
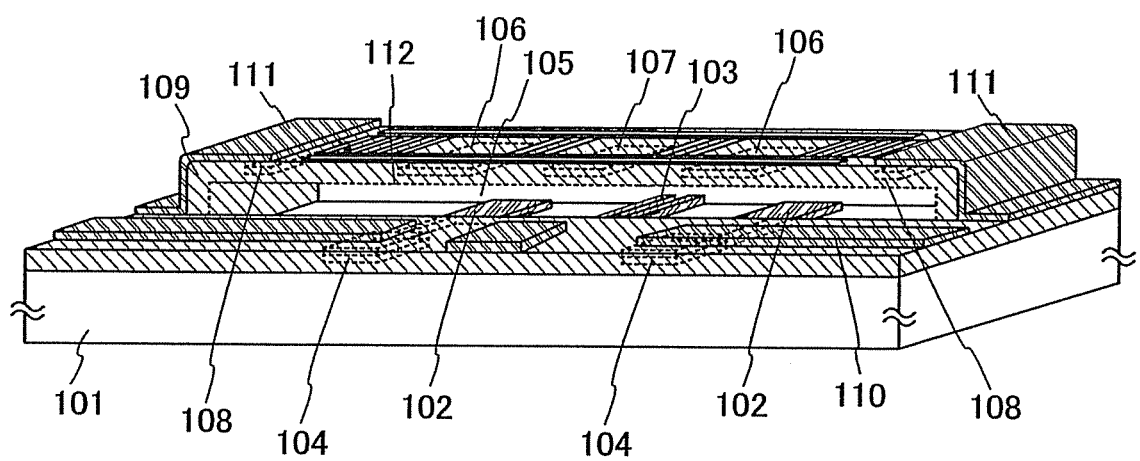
FIG. 1 illustrates a structure of a MEMS switch according to an aspect of the present invention.

As illustrated in FIG. 1, in a MEMS switch, lower driving electrodes 102, a lower switch electrode 103, and lower auxiliary wirings 104 are provided over a substrate 101 having an insulating surface. Further, upper driving electrodes 106, an upper switch electrode 107, and upper auxiliary wirings 108 are provided over the lower driving electrodes 102, the lower switch electrode 103, and the lower auxiliary wirings 104 with a space 105 interposed therebetween. The upper driving electrodes 106, the upper switch electrode 107, and the upper auxiliary wirings 108 are formed to be integrated with a structural layer 109. In FIG. 1, a cross section of the structural layer 109 is partly illustrated by a dashed line 112 to make the description more detailed, but the structural layer 109 actually covers an upper part of the space 105.

The lower driving electrode 102 serves as a fixed electrode which is formed over the substrate 101. On the other hand, the upper driving electrode 106 serves as a movable electrode which is arranged to face the lower driving electrode 102 and operates by electrostatic attraction or electrostatic repulsion generated in the space 105 between the upper driving electrode 106 and the lower driving electrode 102. That is, in the case that the upper driving electrode 106 is attracted to the lower driving electrode 102, the lower switch electrode 103 and the upper switch electrode 107 are in contact with each other and electrically connected to each other; whereas in the case that the upper driving electrode 106 and the lower driving electrode 102 repel each other, the lower switch electrode 103 and the upper switch electrode 107 are separated and electrical connection is terminated.

The MEMS switch illustrated in FIG. 1 has a post-and-beam structure in which either end of the structural layer 109 is fixed to the substrate 101, but the present invention is not limited thereto, and a cantilever structure in which only one end of the structural layer 109 is fixed to the substrate 101 may also be employed. In addition, here, one lower switch electrode 103 and one upper switch electrode 107 are formed, whereas two lower driving electrodes 102 and two upper driving electrodes 106 are formed. However, one lower driving electrode 102 and one upper driving electrode 106 may be formed, or three or more lower driving electrodes 102 and three or more upper driving electrodes 106 may be formed.

The lower driving electrode 102 is electrically connected to a lower connection wiring 110 through the lower auxiliary wiring 104 which is formed in the same plane as the lower driving electrode 102.

The upper driving electrode 106 is electrically connected to an upper connection wiring 111 through the upper auxiliary wiring 108 which is formed in the same plane as the upper driving electrode 106. In the present invention, the upper connection wiring 111 is formed over the structural layer 109 and electrically connected to the upper auxiliary wiring 108 which is formed in the same plane as the upper driving electrode 106, through an opening formed in the structural layer 109 in a position overlapping with the upper auxiliary wiring 108.

Therefore, by applying voltage between the lower connection wiring 110 and the upper connection wiring 111, electrostatic attraction is generated between the lower driving electrode 102 and the upper driving electrode 106, whereby the upper driving electrode 106 which is a movable electrode can operate.

Next, a method for manufacturing a MEMS switch having the above structure will be described with reference to FIGS. 2A to 2D, FIGS. 3A to 3D, FIGS. 4A to 4D, and FIGS. 5A to 5E.

Figure 2A:
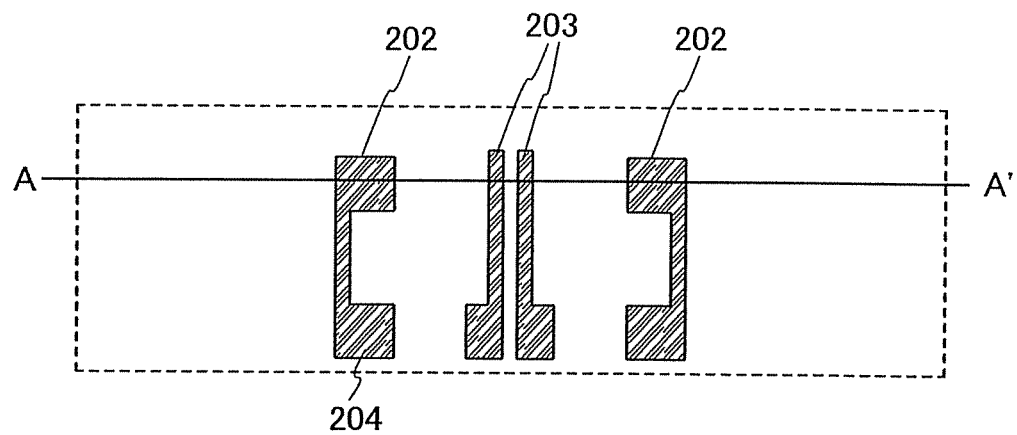
FIGS. 2A to 2D illustrate a method for manufacturing a MEMS switch according to an aspect of the present invention.
Figure 2B:
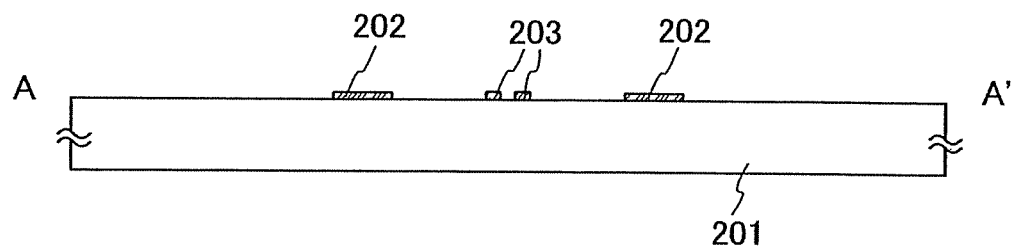

First, as illustrated in FIGS. 2A and 2B, lower driving electrodes 202, a lower switch electrode 203, and lower auxiliary wirings 204 are formed over a substrate 201. FIG. 2A is a top view illustrating part of the MEMS switch illustrated in FIG. 1, and FIG. 2B is a cross-sectional view taken along line A-A' in the top view of FIG. 2A.

The substrate 201 can be a glass substrate, a quartz substrate, a plastic substrate, or the like having an insulating surface. Alternatively, a conductive substrate such as a metal substrate or a semiconductor substrate such as a silicon substrate, over which an insulating film is formed, can be used.

The lower driving electrodes 202, the lower switch electrode 203, and the lower auxiliary wirings 204 are formed by patterning the same conductive film into desired shapes. Here, as the conductive film, for example, a metal material such as tantalum (Ta), aluminum (Al), titanium (Ti), molybdenum (Mo), tungsten (W), gold (Au), or platinum (Pt), a compound (metal oxide or metal nitride) of the metal material, or the like can be used. The thickness of the conductive film is preferably 50 to 700 nm, more preferably 100 to 300 nm. Note that a material is needed to be selected which is not etched at the time of etching a sacrificial layer that is formed in the next step.

In patterning the conductive film, a method is employed in which a resist mask is formed by a photolithography method and then the conductive film is partly removed by an etching method. As an etching method, a dry etching method or a wet etching method can be used. In a dry etching method, an etching gas including $CHF_3$, $ClF_3$, $NH_3$, $CF_4$, or the like can be used. Further, in a wet etching method, an etchant including a hydrogen peroxide solution or an etchant including buffered hydrofluoric acid can be used.

Figure 2C:
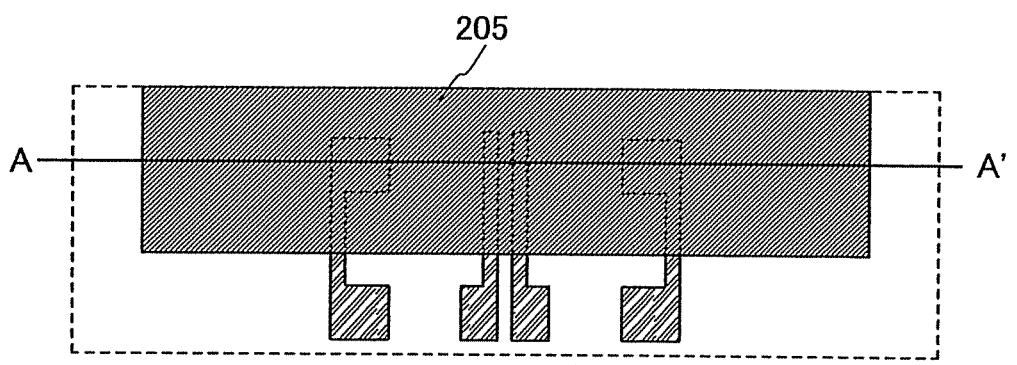
Figure 2D:
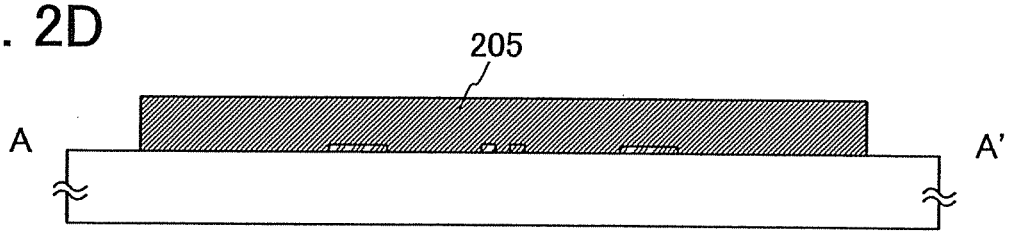

Next, as illustrated in FIGS. 2C and 2D, a sacrificial layer 205 is formed with a desired shape over the substrate 201 so as to cover the lower driving electrodes 202 and a part of the lower switch electrode 203. FIG. 2D is a cross-sectional view taken along line A-A' in a top view of FIG. 2C.

The sacrificial layer 205 is formed to provide a space in part of the MEMS switch later. Therefore, the sacrificial layer 205 is eventually removed by an etching method or the like, so that either a conductive material or an insulating material can be used for the sacrificial layer 205. Note that, as described above, the sacrificial layer 205 is needed to be formed by selecting a material with a higher etching rate than the conductive material used for the lower driving electrodes 202, the lower switch electrode 203, and the lower auxiliary wirings 204, and further, with a higher etching rate than a conductive material used for upper driving electrodes, an upper switch electrode, upper auxiliary wirings, and auxiliary electrodes which are formed later.

In the case of using a conductive material for forming the sacrificial layer 205, a metal material such as tungsten (W) or molybdenum (Mo) can be used. In the case of using an insulating material for forming the sacrificial layer 205, a material which can be easily removed by etching is preferably used such that electrical connection between the switch electrodes (the lower switch electrode and the upper switch electrode) of the MEMS switch is not adversely affected. Specific examples of such a material include a resin material such as an acrylic resin, a phenol resin, a novolac resin, a melamine resin, or an urethane resin; an organic material such as benzocyclobutene, polyamide, polyimide, or resist; an inorganic material such as silicon; and the like.

The thickness of the sacrificial layer 205 is preferably 1 to 5 μm, more preferably 2 to 3 μm.

Figure 3A:
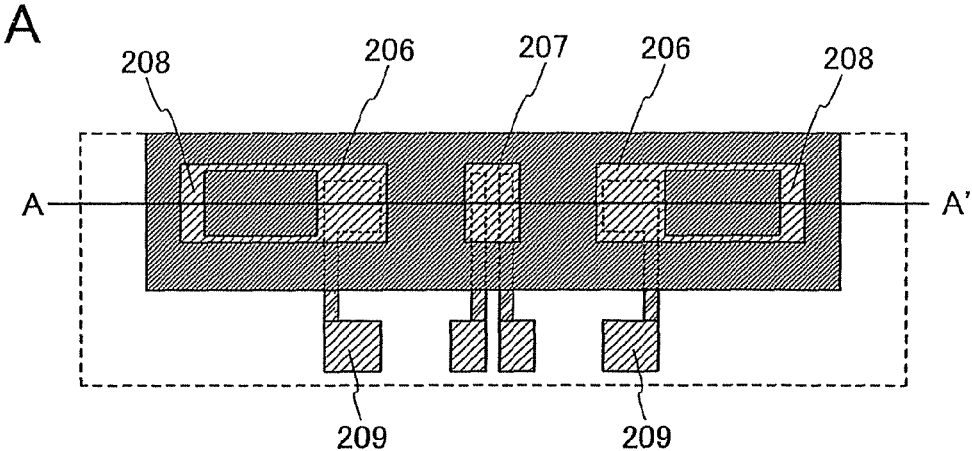
FIGS. 3A to 3D illustrate a method for manufacturing a MEMS switch according to an aspect of the present invention.
Figure 3B:
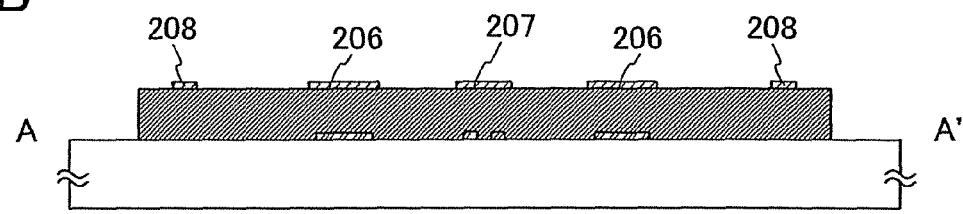

Then, as illustrated in FIGS. 3A and 3B, upper driving electrodes 206, an upper switch electrode 207, and upper auxiliary wirings 208 are formed with desired shapes over the sacrificial layer 205. In addition, auxiliary electrodes 209 are formed with desired shapes over the lower auxiliary wirings 204. FIG. 3B is a cross-sectional view taken along line A-A' in a top view of FIG. 3A.

The upper driving electrodes 206, the upper switch electrode 207, the upper auxiliary wirings 208, and the auxiliary electrodes 209 are formed by pattering the same conductive film into desired shapes. Here, as the conductive film, for example, a metal material such as tantalum (Ta), aluminum (Al), titanium (Ti), molybdenum (Mo), tungsten (W), gold (Au), or platinum (Pt), a compound (metal oxide or metal nitride) of the metal material, or the like can be used. The thickness of the conductive film is preferably 50 to 700 nm, more preferably 100 to 300 nm. Note that a material is needed to be selected which is not etched at the time of etching the sacrificial layer. Specifically, in the case of forming the sacrificial layer using tungsten or molybdenum, the upper driving electrodes and the lower driving electrodes cannot be formed using tungsten or molybdenum.

In patterning the conductive film, a method is employed in which a resist mask is formed by a photolithography method and then the conductive film is partly removed by an etching method. As an etching method, a dry etching method or a wet etching method can be used. In a dry etching method, an etching gas including $CHF_3$, $ClF_3$, $NH_3$, $CF_4$, or the like can be used. Further, in a wet etching method, an etchant including a hydrogen peroxide solution or an etchant including buffered hydrofluoric acid can be used.

The upper auxiliary wiring 208 is formed of the same conductive film and in the same plane as those of the upper driving electrode 206 and is electrically connected to the upper driving electrode 206. Thus, the thickness of the upper auxiliary wiring 208 depends on that of the upper driving electrode 206. Note that the thickness of the upper driving electrode 206 is preferably thin since it serves as a movable electrode.

Since the present invention employs a structure in which the upper auxiliary wirings 208 are formed only over the sacrificial layer 205 (that is, the upper auxiliary wirings 208 are not formed over the structural layer), even when the upper auxiliary wirings 208 are thin, the upper auxiliary wirings 208 can be formed without problems such as disconnection at a step portion caused by the thickness of the sacrificial layer 205.

In addition, the auxiliary electrodes 209 are formed over the lower auxiliary wirings 204 without forming the sacrificial layer 205.

Figure 3C:
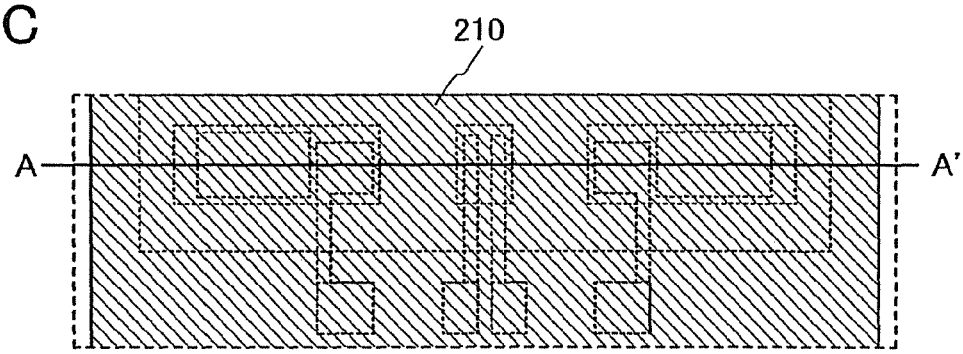
Figure 3D:
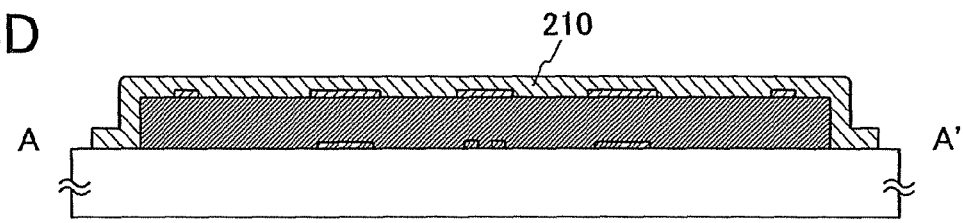

Next, as illustrated in FIGS. 3C and 3D, a structural layer 210 is formed over the sacrificial layer 205, the upper driving electrodes 206, the upper switch electrode 207, the upper auxiliary wirings 208, and the auxiliary electrodes 209. FIG. 3D is a cross-sectional view taken along line A-A' in a top view of FIG. 3C.

The structural layer 210 is formed using an insulating material. Specifically, silicon, silicon oxide, silicon nitride, silicon nitride oxide, silicon oxynitiride, or the like can be used. Note that a material is needed to be selected which is not etched at the time of etching the sacrificial layer 205 in a later step. The structural layer 210 can be formed by a CVD method, a sputtering method, a droplet discharge method (typically, an inkjet method), or a spin coating method. A droplet discharge method or a spin coating method can be used when a starting material is an organic material. In the present invention, the structural layer 210 is preferably formed by a CVD method since the step portion generated due to the sacrificial layer 205 which has been formed can be rounded with the structural layer 210.

The thickness of the structural layer 210 is preferably 1 to 5 more preferably 2 to 3 μm. A three-dimensional structure of the structural layer 210 can be formed by removing, in a later step, the sacrificial layer 205 which has been formed; thus, the structural layer 210 is formed over the entire surface where films have been formed. That is, the structural layer 210 is formed to cover the sacrificial layer 205, the upper driving electrodes 206, the upper switch electrode 207, and the upper auxiliary wirings 208.

Figure 4A:
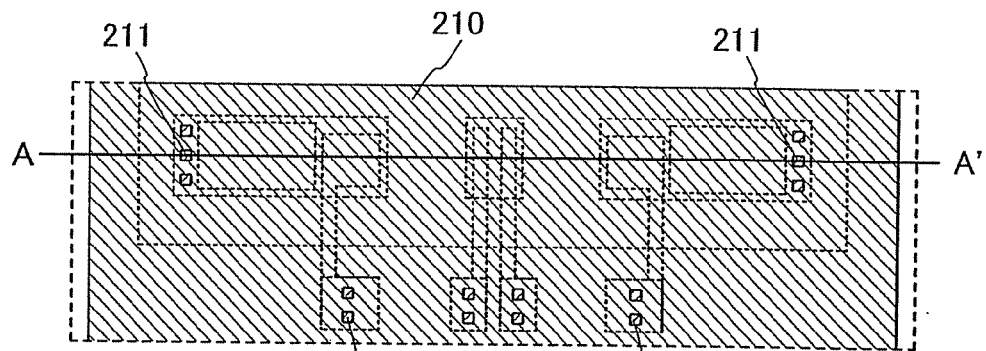
FIGS. 4A to 4D illustrate a method for manufacturing a MEMS switch according to an aspect of the present invention.
Figure 4B:
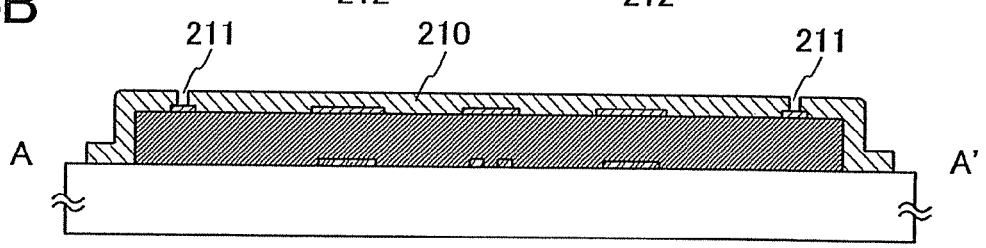

Next, as illustrated in FIGS. 4A and 4B, openings 211 are formed in positions which are part of the structural layer 210 and overlap with the upper auxiliary wirings 208, and openings 212 are formed in positions which are part of the structural layer 210 and overlap with the auxiliary electrodes 209. FIG. 4B is a cross-sectional view taken along line A-A' in a top view of FIG. 4A.

Figure 4C:
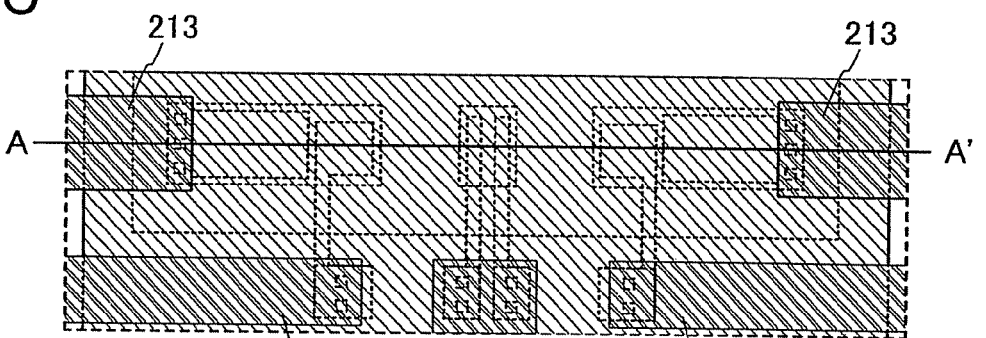
Figure 4D:
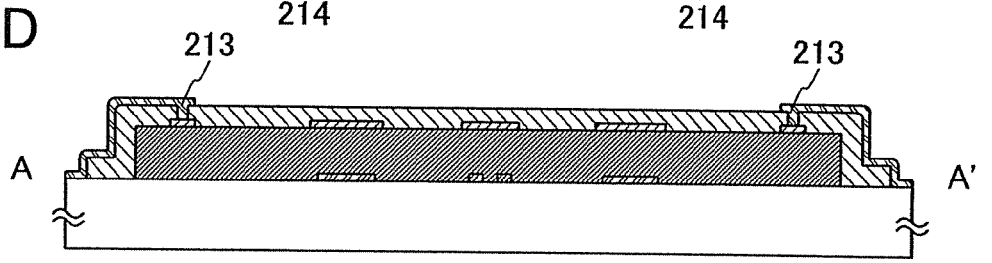

Next, as illustrated in FIGS. 4C and 4D, upper connection wirings 213 and lower connection wirings 214 are formed over the structural layer 210. FIG. 4D is a cross-sectional view taken along line A-A' in a top view of FIG. 4C.

The upper connection wirings 213 and the lower connection wirings 214 are formed by pattering the same conductive film into desired shapes. Here, as the conductive film, for example, a metal material such as tantalum (Ta), aluminum (Al), titanium (Ti), molybdenum (Mo), tungsten (W), gold (Au), or platinum (Pt), a compound (metal oxide or metal nitride) of the metal material, or the like can be used. The thickness of the conductive film is preferably 200 nm to 1 μm, more preferably 300 to 600 nm. Note that a material is needed to be selected which is not etched at the time of etching the sacrificial layer 205 in a later step.

In patterning the conductive film, a method is employed in which a resist mask is formed by a photolithography method and then the conductive film is partly removed by an etching method. As an etching method, a dry etching method or a wet etching method can be used. In a dry etching method, an etching gas including $CHF_3$, $ClF_3$, $NH_3$, $CF_4$, or the like can be used. Further, in a wet etching method, an etchant including a hydrogen peroxide solution or an etchant including buffered hydrofluoric acid can be used.

The upper connection wirings 213 are formed so as to fill the openings 211 and be electrically connected to the upper auxiliary wirings 208. In addition, the lower connection wirings 214 are formed so as to fill the openings 212 and be electrically connected to the auxiliary electrodes 209.

In the present invention, the structural layer 210 is formed over the entire surface where films have been formed (that is, the structural layer 210 is formed to cover all of the sacrificial layer 205, the upper driving electrodes 206, the upper switch electrode 207, and the upper auxiliary wirings 208), and a step is not generated by the thickness of the structural layer 210. Since all the upper connection wirings 213 and all the lower connection wirings 214 are formed only over the structural layer 210, the upper connection wirings 213 and the lower connection wirings 214 can be formed with the sufficient thickness, without being thinned or disconnected due to a step portion.

Figure 5A:
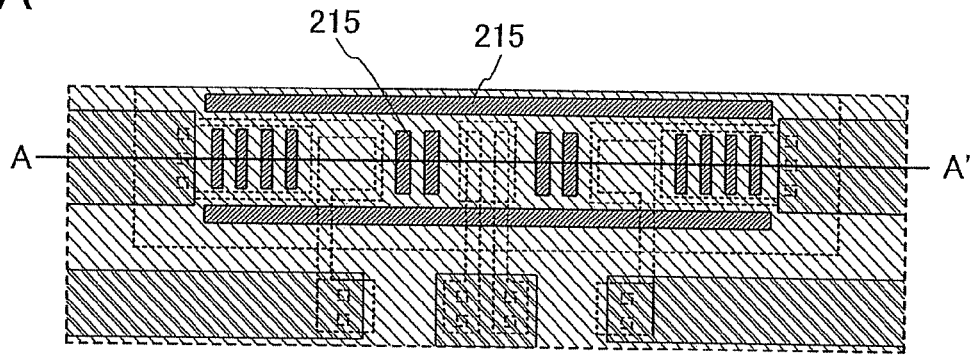
FIGS. 5A to 5E illustrate a method for manufacturing a MEMS switch according to an aspect of the present invention.
Figure 5B:
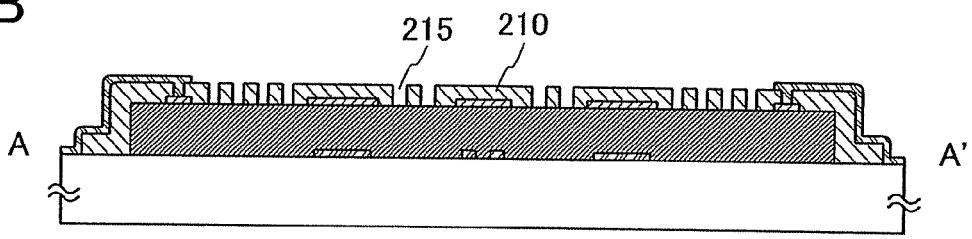

Next, as illustrated in FIGS. 5A and 5B, openings 215 for etching the sacrificial layer 205 are formed in positions which are part of the structural layer 210 and overlap with the sacrificial layer 205. FIG. 5B is a cross-sectional view taken along line A-A' in a top view of FIG. 5A.

In the present invention, the structural layer 210 can have a desired shape only by being formed over the entire surface where films have been formed as described above; thus, in the structural layer 210, only the openings 215 are necessary to be formed over the sacrificial layer 205 by etching treatment. Therefore, only the etching selectivity between the material used for forming the sacrificial layer 205 and the material used for forming the structural layer 210 is needed to be taken into consideration, so that the etchant can easily be selected. In addition, because only the openings 215 are necessary to be formed in the structural layer 210, generation of dusts in etching treatment can be suppressed to the minimum.

Figure 5C:
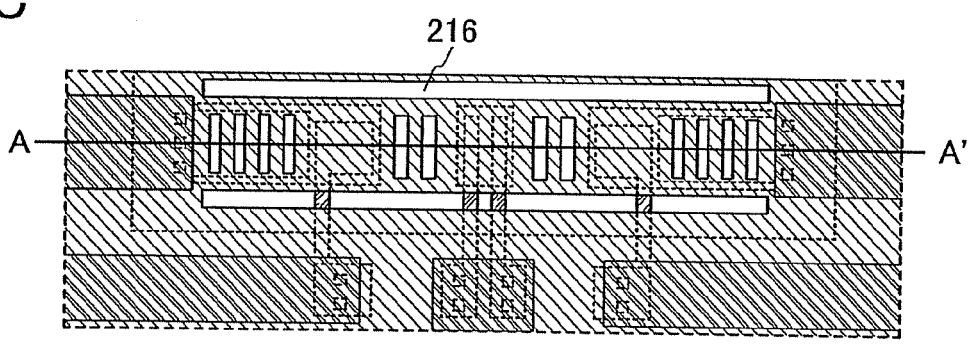
Figure 5D:
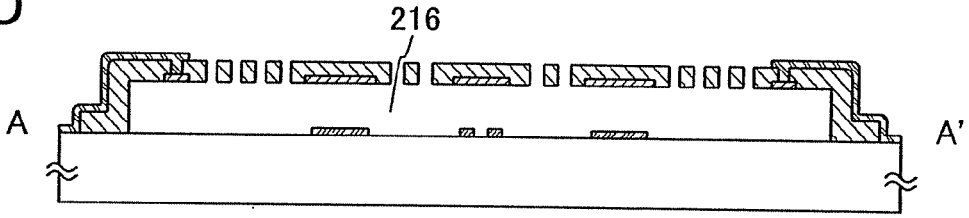

Next, as illustrated in FIGS. 5C and 5D, the sacrificial layer 205 is etched using the openings 215 which are formed in part of the structural layer 210, whereby a space 216 is formed. FIG. 5D is a cross-sectional view taken along line A-A' in a top view of FIG. 5C.

In etching the sacrificial layer 205, a dry etching method or a wet etching method can be used. In a dry etching method, an etching gas including $CHF_3$, $ClF_3$, $NH_3$, $CF_4$, or the like can be used. Further, in a wet etching method, an etchant including a hydrogen peroxide solution or an etchant including buffered hydrofluoric acid can be used.

For example, the lower driving electrodes 202, the lower switch electrode 203, and the lower auxiliary wirings 204 are formed using any of tantalum (Ta), aluminum (Al), titanium (Ti), gold (Au), or platinum (Pt); the sacrificial layer 205 is formed using tungsten (W); the upper driving electrodes 206, the upper switch electrode 207, and the upper auxiliary wirings 208 are formed using any of tantalum (Ta), aluminum (Al), titanium (Ti), gold (Au), or platinum (Pt); and the structural layer 210 is formed using silicon oxide. In such a case, a wet etching method using a mixed solution of an ammonia solution (28 wt %) and a hydrogen peroxide solution (31 wt %) (mixing ratio=1:2) or a dry etching method using a chlorine trifluoride ($ClF_3$) gas can be used.

When polyimide is used for the sacrificial layer 205 in the above combination, a wet etching method using a commercially available polyimide etchant or a dry etching method using oxygen plasma can be used.

Further, when silicon is used for the sacrificial layer 205 and silicon oxide is used for the structural layer 210 in the above combination, a wet etching method using phosphoric acid, hydroxide such as potassium hydroxide, sodium hydroxide, or cesium hydroxide, a tetramethylammonium hydroxide (TMAH) solution, or the like can be used. In etching the sacrificial layer 205, a portion which is exposed to the etchant is needed to be formed using a material which can have sufficient etching selectivity to the sacrificial layer 205 and which is not etched even when etching time of the sacrificial layer 205 is long.

Figure 5E:
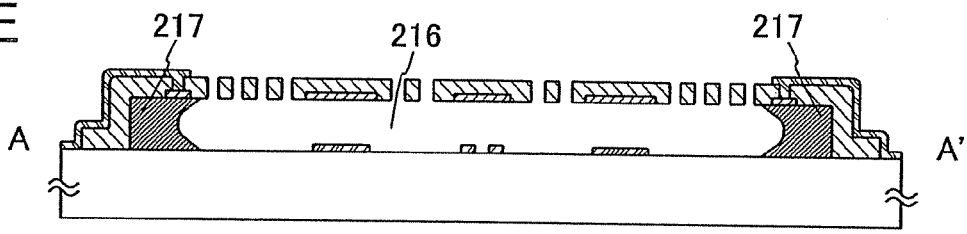

In addition, by adjusting etching conditions of the sacrificial layer 205, a structure (a so-called sidewall structure) may be formed in which part of the sacrificial layer 205 (a part 217 in FIG. 5E) is left on the side surface of the structural layer 210, as illustrated in FIG. 5E. The thickness of the side surface of the structural layer 210 is thin, but with the sidewall structure, the weak side surface of the structural layer 210 can be supported.

By etching and removing the sacrificial layer 205 as described above, the space 216 is formed, so that the MEMS switch of the present invention can be formed.

As described above, in the MEMS switch described in Embodiment Mode 1, the upper auxiliary wirings 208 which are electrically connected to the upper driving electrodes 206 are formed over the sacrificial layer 205 and connected to the upper connection wirings 213 whose thickness can be relatively freely determined, over the sacrificial layer 205. Therefore, even when the upper driving electrodes 206 are formed thinly, thinning, disconnection, and the like of the upper auxiliary wirings 208 at the step portion generated due to the sacrificial layer 205 can be prevented. Therefore, a highly reliable MEMS switch can be formed.

A plurality of the MEMS switches described in Embodiment Mode 1 are provided or the MEMS switch described in Embodiment Mode 1 is combined with a different kind of a semiconductor element such as a transistor or a diode, whereby an integrated micromachine can be formed.

This application is based on Japanese Patent Application Serial No. 2007-314456 filed with Japan Patent Office on Dec. 5, 2007, the entire contents of which are hereby incorporated by reference.

What is claimed is:

1. A method for manufacturing a micromachine, comprising:
    forming a first conductive layer over a substrate having an insulating surface;
    forming a sacrificial layer over the first conductive layer;
    forming a second conductive layer over the sacrificial layer;
    forming a structural layer over the second conductive layer;
    forming a first opening in the structural layer;
    forming a third conductive layer over the structural layer, the third conductive layer being electrically connected to the second conductive layer through the first opening;
    forming a second opening in the structural layer; and
    removing the sacrificial layer by etching using the second opening.

2. A method for manufacturing a micromachine according to claim 1,
    wherein the sacrificial layer is removed by wet etching or by dry etching.

3. A method for manufacturing a micromachine according to claim 1,
    wherein the structural layer comprises silicon.

4. A method for manufacturing a micromachine, comprising:
    forming a first conductive layer over a substrate having an insulating surface;

forming a sacrificial layer over the first conductive layer;
forming a second conductive layer over the sacrificial layer;
forming a structural layer over the second conductive layer;
forming a first opening in the structural layer;
forming a third conductive layer over the structural layer, the third conductive layer being electrically connected to the second conductive layer through the first opening;
forming a second opening in the structural layer; and
removing totally the sacrificial layer by etching using the second opening.

5. A method for manufacturing a micromachine according to claim 4,
wherein the sacrificial layer is removed by wet etching or by dry etching.

6. A method for manufacturing a micromachine according to claim 4,
wherein the structural layer comprises silicon.

7. A method for manufacturing a micromachine, comprising:
forming a first conductive layer over a substrate having an insulating surface;
forming a sacrificial layer over the first conductive layer;
forming a second conductive layer over the sacrificial layer;
forming a structural layer over the second conductive layer;
forming a first opening in the structural layer;
forming a third conductive layer over the structural layer, the third conductive layer being electrically connected to the second conductive layer through the first opening;
forming a second opening in the structural layer; and
removing partially the sacrificial layer by etching using the second opening.

8. A method for manufacturing a micromachine according to claim 7,
wherein a sidewall structure is formed in the sacrificial layer on a side surface of the structural layer.

9. A method for manufacturing a micromachine according to claim 7,
wherein the sacrificial layer is removed by wet etching or by dry etching.

10. A method for manufacturing a micromachine according to claim 7,
wherein the structural layer comprises silicon.

11. A method for manufacturing a micromachine, comprising:
forming a first conductive layer over a substrate having an insulating surface;
forming a sacrificial layer over the first conductive layer;
forming a second conductive layer over the sacrificial layer;
forming a structural layer by a CVD method over the second conductive layer;
forming a first opening in the structural layer;
forming a third conductive layer over the structural layer, the third conductive layer being electrically connected to the second conductive layer through the first opening;
forming a second opening in the structural layer; and
removing the sacrificial layer by etching using the second opening.

12. A method for manufacturing a micromachine according to claim 11,
wherein the sacrificial layer is removed by wet etching or by dry etching.

13. A method for manufacturing a micromachine according to claim 11,
wherein the structural layer comprises silicon.

14. A method for manufacturing a micromachine, comprising:
forming a first conductive layer over a substrate having an insulating surface;
forming a sacrificial layer over the first conductive layer;
forming a second conductive layer over the sacrificial layer;
forming a structural layer by a CVD method over the second conductive layer;
forming a first opening in the structural layer;
forming a third conductive layer over the structural layer, the third conductive layer being electrically connected to the second conductive layer through the first opening;
forming a second opening in the structural layer; and
removing totally the sacrificial layer by etching using the second opening.

15. A method for manufacturing a micromachine according to claim 14,
wherein the sacrificial layer is removed by wet etching or by dry etching.

16. A method for manufacturing a micromachine according to claim 14,
wherein the structural layer comprises silicon.

17. A method for manufacturing a micromachine, comprising:
forming a first conductive layer over a substrate having an insulating surface;
forming a sacrificial layer over the first conductive layer;
forming a second conductive layer over the sacrificial layer;
forming a structural layer by a CVD method over the second conductive layer;
forming a first opening in the structural layer;
forming a third conductive layer over the structural layer, the third conductive layer being electrically connected to the second conductive layer through the first opening;
forming a second opening in the structural layer; and
removing partially the sacrificial layer by etching using the second opening.

18. A method for manufacturing a micromachine according to claim 17,
wherein a sidewall structure is formed in the sacrificial layer on a side surface of the structural layer.

19. A method for manufacturing a micromachine according to claim 17,
wherein the sacrificial layer is removed by wet etching or by dry etching.

20. A method for manufacturing a micromachine according to claim 17,
wherein the structural layer comprises silicon.

* * * * *